United States Patent
Zimlich

(10) Patent No.: US 7,408,394 B2
(45) Date of Patent: Aug. 5, 2008

(54) MEASURE CONTROL DELAY AND METHOD HAVING LATCHING CIRCUIT INTEGRAL WITH DELAY CIRCUIT

(75) Inventor: David A. Zimlich, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/900,451

(22) Filed: Sep. 11, 2007

(65) Prior Publication Data

US 2008/0030249 A1 Feb. 7, 2008

Related U.S. Application Data

(63) Continuation of application No. 11/219,302, filed on Sep. 1, 2005, now Pat. No. 7,274,237.

(51) Int. Cl.
*H03H 11/26* (2006.01)
(52) U.S. Cl. .................. 327/261; 327/264; 327/285
(58) Field of Classification Search ................. 327/261, 327/263, 264, 285, 288
See application file for complete search history.

(56) References Cited

U.S. PATENT DOCUMENTS

| | | | | |
|---|---|---|---|---|
| 5,532,632 | A | 7/1996 | Kent | 327/141 |
| 6,172,544 | B1 | 1/2001 | Sugamori | 327/263 |
| 6,177,823 | B1 | 1/2001 | Saeki | 327/277 |
| 6,801,070 | B2 * | 10/2004 | Gomm et al. | 327/263 |
| 7,212,057 | B2 * | 5/2007 | Gomm et al. | 327/263 |
| 7,332,950 | B2 * | 2/2008 | Blodgett | 327/269 |

* cited by examiner

*Primary Examiner*—N. Drew Richards
*Assistant Examiner*—An T. Luu
(74) *Attorney, Agent, or Firm*—Dorsey & Whitney LLP

(57) ABSTRACT

A measure control delay includes a measuring delay line and a signal generating delay line, each of which include a plurality of series-connected delay units. A digital signal is applied to an initial delay unit in the measuring delay line and it sequentially propagates through the delay units until a second digital signal is received. These outputs are applied to control inputs to the signal generating delay line to control the number of delay units through which a clock signal propagates before being output from a final delay unit. Each of the delay units in the measuring delay line includes a pair of series connected NOR gates. A NOR gate to which the digital signal is initially applied is coupled to a second NOR gate as a flip-flop so that the output of the NOR gate remains constant after the digital signal has been applied to the measuring delay line.

26 Claims, 7 Drawing Sheets

US 7,408,394 B2

MEASURE CONTROL DELAY AND METHOD HAVING LATCHING CIRCUIT INTEGRAL WITH DELAY CIRCUIT

CROSS-REFERENCE TO RELATED APPLICATION

This application is a continuation of pending U.S. patent application Ser. No. 11/219,302, filed Sep. 1, 2005 now U.S. Pat. No. 7,274,237.

TECHNICAL FIELD

This invention relates to integrated circuits, and more specifically to a system and method used in an integrated circuit for generating internal clock signals that are synchronized with external clock signals applied to the integrated circuit.

BACKGROUND OF THE INVENTION

Periodic digital signals are commonly used in a variety of electronic devices. Probably the most common type of periodic digital signals are clock signals that are typically used to establish the timing of a digital signal or the timing at which an operation is performed on a digital signal. For example, in synchronous integrated circuits, the integrated circuit is clocked by an external clock signal and it performs operations at predetermined times relative the rising and falling edges of the applied clock signal. Examples of synchronous integrated circuits include synchronous memory devices such as synchronous dynamic random access memories (SDRAMs), synchronous static random access memories (SSRAMs), and packetized memories like SLDRAMs and RDRAMs, and include other types of integrated circuits as well, such as microprocessors.

The timing of signals external to a synchronous memory device is determined by the external clock signal, and operations within the memory device typically must be synchronized to external operations. For example, commands and addresses are placed on respective command and address buses of the memory device in synchronism with the external clock signal, and the memory device uses the external clock signal to latch these commands and addresses at the proper times to successfully capture the commands and addresses. Similarly, write data are applied to a data bus in synchronism with a write data strobe signal, and the memory device uses the write data strobe signal to latch the write data at the proper time.

Internal circuitry in a memory device through which the external clock and strobe signals are coupled necessarily introduces some time delay, causing the clock and strobe signals to be phase shifted by the time they reach respective latches. As long as the phase-shift is minimal relative to the timing margins of the memory device, the external clock and strobe signals can capture the commands, addresses and data at the proper time. However, as the operating speeds of memory devices have continued to increase, the "eyes" during which the commands, addresses and data must be captured have become increasingly smaller, thus making the timing of the clock and strobe signals even more critical. As a result, the time delays introduced by internal circuitry have become more significant.

To latch the applied commands, addresses, and write data at higher operating speeds, internal clock and strobe signals are developed in synchronism with the external clock and strobe signal, respectively. The internal clock signal is applied to latches contained in the memory device to thereby clock the commands and addresses into the latches during an "eye" in which the commands and addresses are valid. Similarly, the internal write data strobe signal is used to capture the write data in a latch at the proper time to ensure that a transition of the internal write data strobe signal occurs during an "eye" in which the write data are valid. A similar technique is often used in a memory controller coupled to a synchronous memory device. In such case, the memory device transmits read data and a read data strobe to the memory controller. The memory controller uses an internal read data strobe signal synchronized to the external read data strobe signal to capture the read data during the "eye" when the read data are valid.

A number of different approaches have been considered and utilized to generate internal clock and strobe signals that are synchronized to external clock and strobe signals, respectively. For example, delay-locked loops (DLLs), phased-locked loops (PLLs), measure controlled delays (MCDs), and synchronous mirror delays ("SMDs") have been used, as will be appreciated by those skilled in the art. FIG. 1 is a functional block diagram of a conventional MCD 100 that receives an applied clock signal CLK and generates a clock signal CLKSYNC that is synchronized with the CLK signal. The MCD 100 includes an input buffer 102 that receives the CLK and generates a buffered clock signal CLKBUF in response to the CLK signal. The CLKBUF signal has a delay D1 relative to the CLK signal, where D1 corresponds to the inherent propagation delay of the input buffer.

A model delay line 104 receives the CLKBUF signal and generates a forward delay clock signal FDCLK having a model delay D1+D2 relative to the CLKBUF signal. The model delays D1 and D2 simulate the delay D1 introduced by the input buffer 102 and a delay D2 introduced by an output buffer 106 that generates the CLKSYNC signal, as will be explained in more detail below. The FDCLK signal propagates through a measuring delay line 108 including a plurality of delay units 110A-N coupled in series, each delay unit 11-A-N receiving an input signal from the prior delay unit generates an output signal having a delay UD relative to the input signal. Each delay unit 110A-N may, for example, be an AND gate having one input enabled as indicated for the delay unit 11A, with the inverter introducing the delay unit UD corresponding to the propagation delay of the inverter. In the measuring delay line 108, the FDCLK signal propagates through the delay units 110A-N from left to right in FIG. 1, as indicated by the orientation of the inverter in the delay unit 110A. Each of the delay units 110A-N generates a corresponding control signal on lines 112A-N, respectively. As the FDCLK signal propagates through the delay units 110A-N, a control signal at the corresponding output 112 A-N changes state.

A signal generating delay line 114 includes a plurality of delay units 116A-N coupled in series as previously described for the measuring delay line 108. Instead of providing the outputs from the delay units 116A-N as with the measuring delay line 108, however, the signal generating delay line 114 has a plurality of inputs 118A-N to the corresponding delay unit 116A-N, respectively. Once again, each delay unit 116A-N may be formed by an AND gate. A controller 120 receiving the CLKBUF signal is coupled to receive the control signals on lines 112A-N of the measuring delay line 108. The controller 120 then outputs the CLKBUF signal on one of the inputs 118A-N of the delay units 116A-N in the signal generating delay line 114. The controller 120 uses the control signals from the measuring delay line 108 to determine the delay units 110A-N through which the rising edge of the FDCLK signal propagated by the time the next rising edge of the CLKBUF signal is received. The controller 120 then applies the CLKBUF signal to the input 118A-N of the delay unit 116A-N in the signal generating delay line 114 that corresponds to the delay unit 110A-N in the measuring delay line 108 to which the FDCLK signal had propagated. For example, if the rising edge of the FDCLK signal has propagated to the output of the delay unit 110J by the time the next rising edge of the CLKBUF signal is received, the controller 120 applies the CLKBUF signal to the input of the delay unit 116J in the signal generating delay line 114. The CLKBUF signal then propagates through the corresponding delay unit 116J in the signal generating delay line 114 and through all delay units 116I-A to the left of that delay unit, and is output from the signal generating delay line 114 as a delayed clock signal CLKDEL. The output buffer 106 receives the CLKDEL signal and generates the CLKSYNC in response to the CLKDEL signal, with the CLKSYNC being delayed by the delay D2 introduced by the output buffer.

The overall operation of the MCD 100 in synchronizing the CLKSYNC signal with the CLK signal will now be described in more detail with reference to FIG. 1 and a signal timing diagram of FIG. 2 illustrating various signals generated by the MCD during operation. In the example of FIG. 2, an initial rising-edge of the CLK signal occurs at time T0. In response to the rising-edge of the CLK signal at the time T0, the input buffer 102 drives the CLKBUF signal high with a delay D1 at time T1. This initial rising-edge of the CLKBUF signal is designated in FIG. 2 the N edge of the CLKBUF signal. In response to the rising-edge transition of the CLKBUF signal at the time T1, the model delay line 104 drives the FDCLK signal high after a model delay D1+D2 at time T2. The FDCLK signal thereafter propagates through the delay units 110A-N in the measuring delay line 108 until a next rising-edge N+1 of the CLKBUF signal is applied to the measuring delay line 108 at a time T3. At the time T3, the measuring delay line 108 has delayed the FDCLK signal by a delay FD that equals TCK−(D1+D2) where TCK is the period of the CLK signal. This is true because, as illustrated in FIG. 2, the next rising-edge of the CLKBUF signal occurs TCK−(D1+D2) after the initial rising-edge of the FDCLK signal at the time T2.

In response to the rising-edge of the CLKBUF signal at the time T3, the controller 120 applies the CLKBUF signal to the input of the delay unit 116A-N in the signal generating delay line that corresponds to the delay unit 10A-N to which the FDCLK signal had propagated when the rising edge of the CLKBUF signal was received. For example, assume that the delay TCK−(D1+D2) equals eleven delay units UD so that the controller 120 receives the control signal from the output 112K of the delay unit 110K in the measuring delay line 108. In this situation, the controller 120 applies the CLKBUF signal to the input 118K of the delay unit 116K in the signal generating delay line 114. This is illustrated in FIG. 2 as a rising-edge of the CLKBUF signal at the time T3.

The CLKBUF thereafter propagates through the appropriate delay units 116J-A in the signal generating delay line 114, and at a time T4 the signal generating delay line 114 drives the CLKDEL signal high in response to the applied output signal. At the time T4, the signal generating delay line 114 has delayed the CLKBUF by a delay that equals TCK−(D1+D2) which equals the delay FD of the measuring delay line 108. This is true because the CLKBUF signal propagates through the same number of delay units 116A-N in the signal generating delay line 114 as did the FDCLK signal propagate through the delay units 10A-N in the measuring delay line 108, as will be appreciated by those skilled in the art. The total delay of the CLKDEL signal at the time T4 equals D1+D1+D2+TCK−(D1+D2)+TCK−(D1+D2), which equals 2TCK−D2. Thus, the rising-edge of the CLKDEL signal at the time T4 occurs the delay D2 of the output buffer 106 before a next rising-edge of the CLK signal at a time T5. In response to the CLKDEL signal at the time T4, the output buffer 106 drives the CLKSYNC signal high at the time T5 and in synchronism with the rising-edge of the CLK signal. In this way, the MCD 100 generates the CLKSYNC signal having rising-edges that are synchronized with the rising-edges of the CLK signal.

In the MCD 100, although the input buffer 102 and output buffer 106 are illustrated as single components, each represents all components and the associated delays between the input and output of the MCD 100. The input buffer 106 thus represents the delay D1 of all components between an input that receives the CLK signal and the input to the model delay line 104, and the output buffer 106 represents the delay D2 of all components between the output of the signal generating delay line 114 and an output at which the CLKSYNC signal is developed, as will be appreciated by those skilled in the art.

As explained above, the controller 120 performs the function of applying the CLKBUF signal to one of the inputs 118A_N of the corresponding delay unit 116A-N in the signal generating delay line 114. As mentioned above, the controller 120 generally performs this function by detecting which delay units 110A-N in the measuring delay line 108 are outputting a high logic level when the next rising edge of the CLKBUF signal occurs. However, if the FDCLK signal simply propagated through the delay units 110A-N, the first half of the delay units 110A-N would be outputting a low logic level and the second half of the delay units 110A-N would be outputting a high logic level on the occurrence of the next rising edge of the CLKBUF signal. The mix of high and low logic levels from the delay units 110A-N would be even more complicated if, as in some MCDs, several periods of the FDCLK signal are allowed to propagate through the measuring delay line 108.

The mix of high and low logic levels that the controller 120 receives from the measuring delay line 108 can make it difficult for the controller 120 to perform its function of applying the CLKBUF signal to the correct delay unit 116A-N in the signal generating delay line 114. For this reason, MCDs typically include a control circuit (not shown) inserted between the model delay line 104 and the measuring delay line 108 for maintaining the FDCLK signal high responsive to the rising edge of the FDCLK signal. As a result, all of the delay units 110A-N through which the rising edge of the FDCLK signal propagates will output a high regardless of how many periods of the FDCLK signal have occurred during such time. Unfortunately, these control circuits inevitably delay the signal applied to the measuring delay line 108 responsive to the rising edge of the FDCLK signal. At higher operating speeds, these delays must be compensated for with a delay model, but such delay models do not always provide adequate compensation particularly in the presence of temperature, process and supply voltage variations.

The results achieved with the above-described control circuits, i.e., ensuring that all of the delay units 110A-N through which the rising edge of the FDCLK signal propagates output a high, could be achieved without using a control circuit by making the measuring delay line responsive to the falling edge of the CLKBUF signal. However, this approach would provide accurate results only if the falling edge of the FDCLK signal occurs after one-half period of the FDCLK signal. Unfortunately, external clock and strobe signals often do not have a 50% duty cycle. Therefore, this approach cannot be used in many cases.

There is therefore a need for an MCD having a measuring delay line that, for the entire period of an input signal, outputs high logic levels from all delay units 110A-N through which a transition of an input signal propagates without passing the input signal through a control circuit that introduces undesirable delays to the input signal.

SUMMARY OF THE INVENTION

A Measure Control delay system and method includes a measuring delay line and a signal generating delay line, each of which has a plurality of series connected delay units. The delay units in the measuring delay line include at least one logic gate through which a digital signal is coupled to establish respective delays. One of these logic gates in an initial delay unit to which the digital signal is applied is coupled to a second logic gate in a manner that causes the output of the logic gate to remain constant when its output changes state responsive to the digital signal being coupled through the logic gate. As a result, all of the measuring delay line delay units through which the digital signal has propagated output the same logic level.

DETAILED DESCRIPTION

Figure 3:
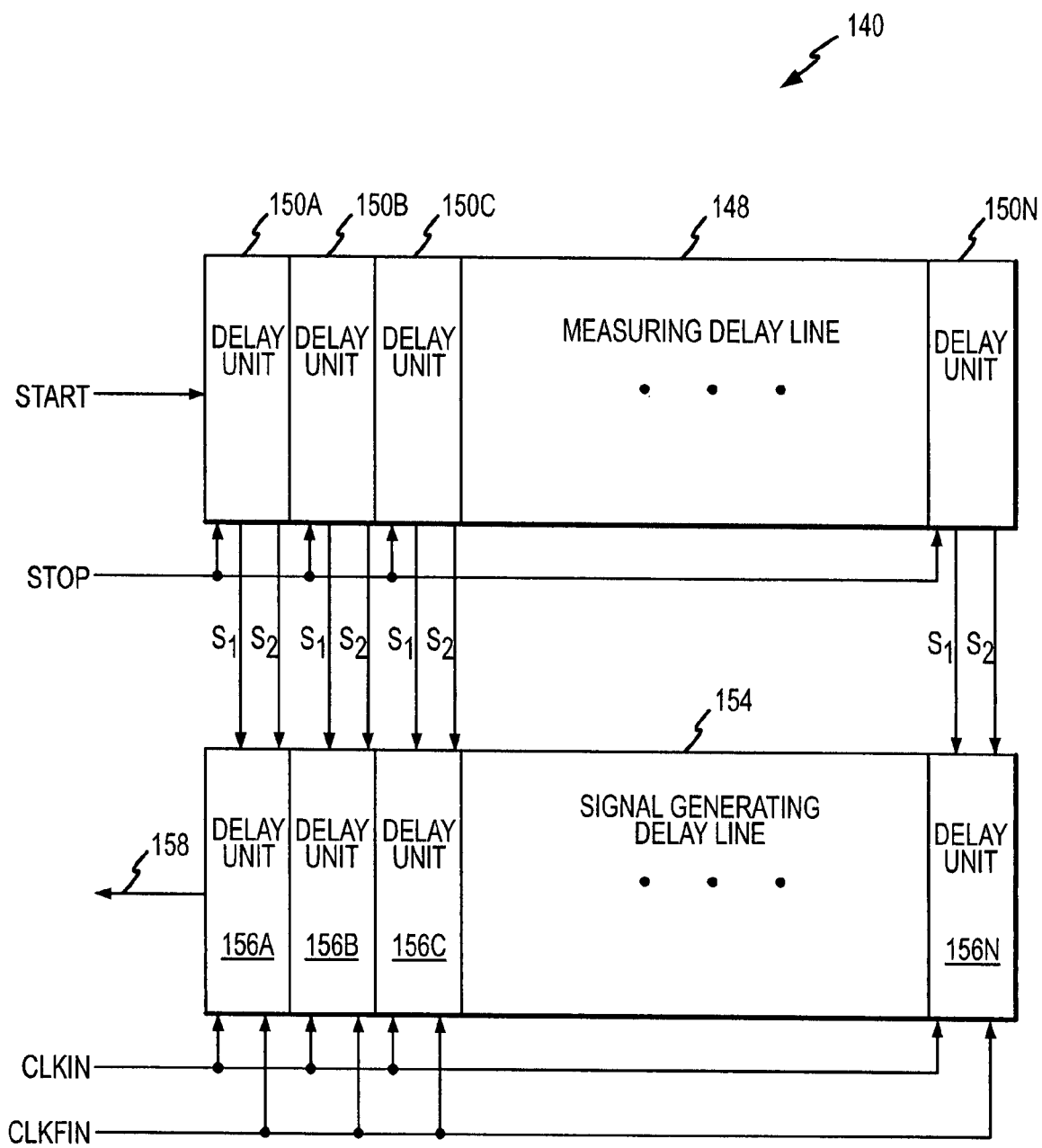
FIG. 3 is a block diagram of a measure-control delay according to one example of the invention.

A measure control delay ("MCD") 140 according to one example of the invention is shown in FIG. 3. The MCD 140 includes a measuring delay line 148 having a plurality of series connected delay units 150A-N, the first of which 150A receives a START signal. The rising edge of the START signal propagates through each of the delay units 150A-N from the first 150A toward the last 150N. The MCD 140 also receives a STOP signal that terminates the propagation of the START signal through the delay units 150A-N. The START signal may be generated by conventional circuitry (not shown) responsive to the rising edge of an external clock signal, and the STOP signal may be generated by conventional circuitry (not shown) responsive to the next rising edge of the external clock signal. Of course, these signals may be generated by other means.

The START signal is applied directly to the first delay unit 150A without first passing through or being applied to a control circuit of the type described above for ensuring that only a single logic level propagates through the delay units 150A-N. Instead, as explained in greater detail below, the function of ensuring that only a single logic level propagates through the delay units 150A-N responsive to the rising edge of the START signal is provided by the first delay unit 150A. However, as also explained below, the circuitry used in the first delay unit 150A that causes only high logic levels to propagate through the unit 150B-N delays the rising edge of the START signal to substantially the same extent that remaining delay units 150B-N delay the rising edge of the START signal. As a result, no unwanted delays are generated.

Each of the delay units 150A-N in the measuring delay line 148 includes two delay stages (not shown in FIG. 3), each of which provides a respective output signal $S_1$, $S_2$. In operation, as the rising edge of the START signal propagates to the output of each of the delay stages in each of the delay units 150A-N, its output transitions from a low logic level to a high logic level. Thus, the location in the measuring delay line 148 where the outputs transition from a high level to a low level provides an indication of the degree to which the START signal has propagated through the delay line 148.

The MCD 140 also includes a signal generating delay line 154 having a plurality of delay units 156A-N coupled in series with each other as previously described for the measuring delay line 148. Each delay unit 156A-N in the signal generating delay line 154 includes two delay stages, each of which receives a control input 158a,b. The control inputs 158a,b are connected to receive the signals $S_1$, $S_2$ from the corresponding delay unit 150A-N.

Figure 1:
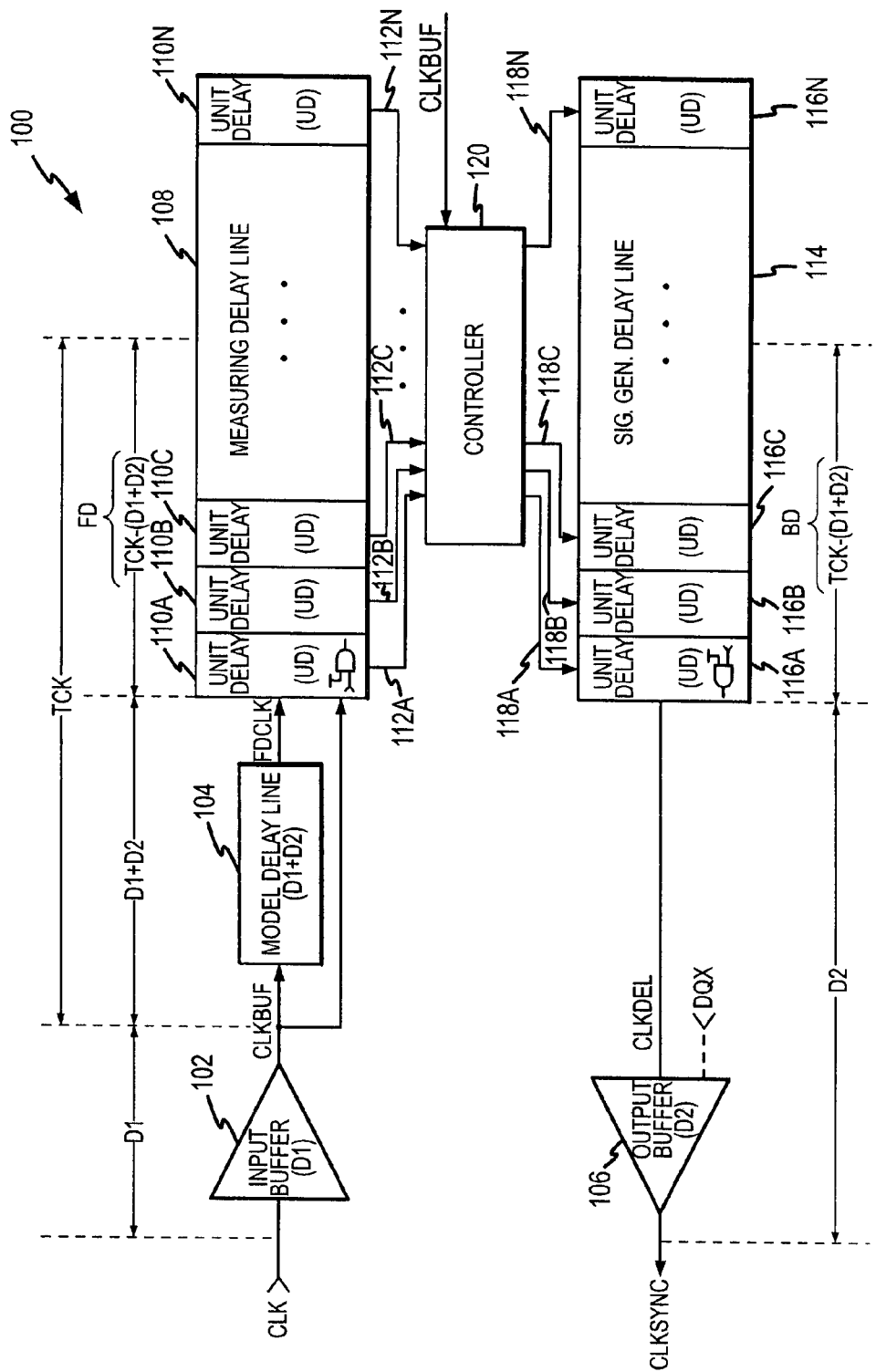
FIG. 1 is a block diagram of a conventional measure control delay.
Figure 2:
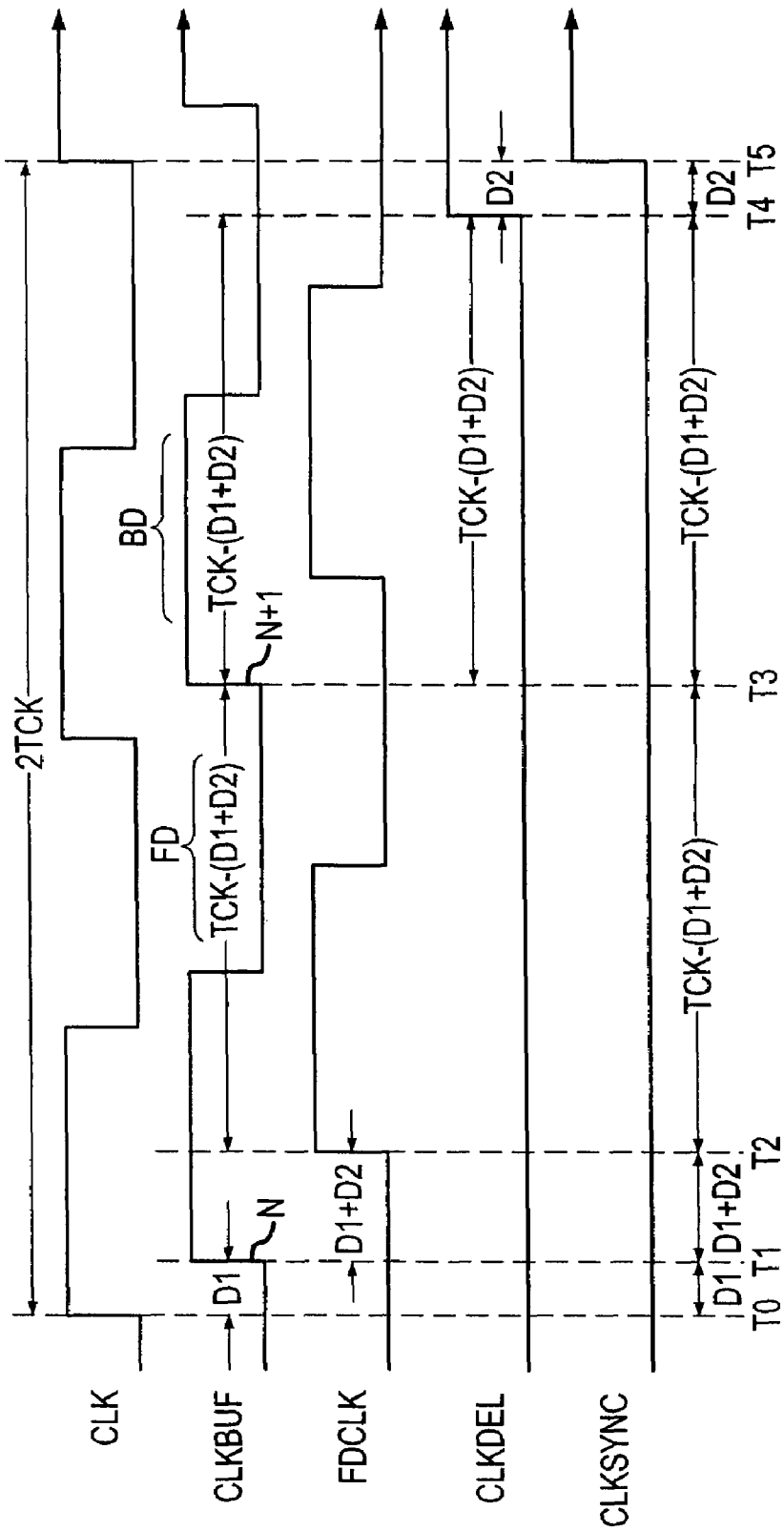
FIG. 2 is a signal timing diagram showing various signals generated during operation of the measured control delay of FIG. 1.

Each of the delay units 156A-N in the signal generating delay line 154 also receives a clock signal CLKIN and its complement CLKFIN. In operation, either the CLKIN signal or the CLKFIN is injected into the signal generating delay line 154 at the first (i.e., leftmost stage as shown in FIG. 3) delay stage in a delay unit 156A-N that still receives a low signal $S_1$ or $S_2$. The CLKIN or CLKFIN then propagates from right to left as shown in FIG. 3 from the delay stage where it is injected to an output terminal 158. Therefore, the number of delay stages in the delay units 156A-N of the signal generating delay line 154 through which either the CLKIN or CLKFIN signal propagates is equal to the number of delay stages in the delay units 150A-N of the measuring delay line 148 through which the START signal propagates before the STOP signal occurs. It will be understood that the MCD 140 may also use buffers and model delay circuits like those used in the MCD 100 of FIG. 1, as well as any other type of circuitry that can be used with or in the MCD 140.

Figure 4:
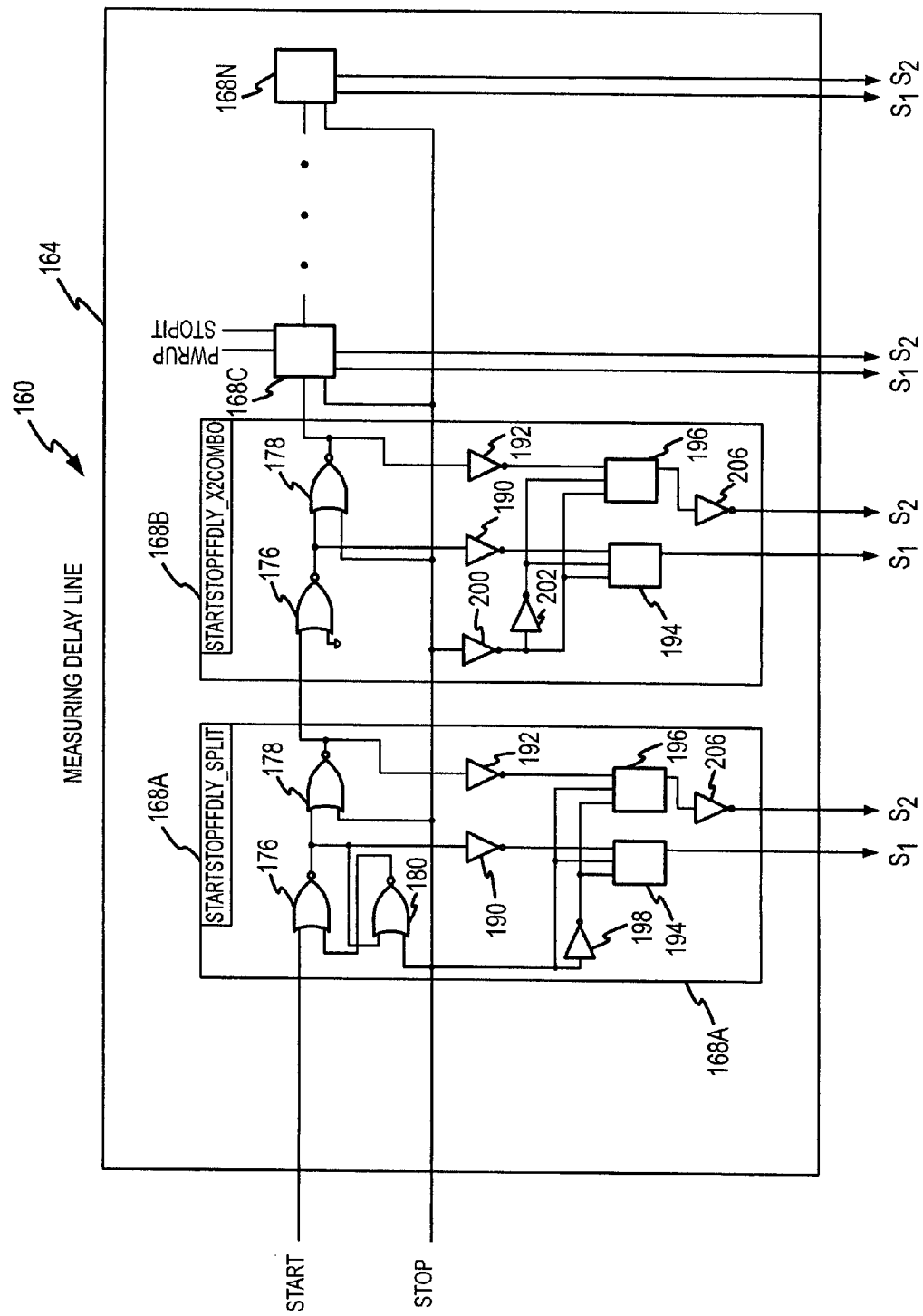
FIG. 4 is a logic diagram of one example of a measuring delay line used in the measure controlled delay of FIG. 3.
Figure 5:
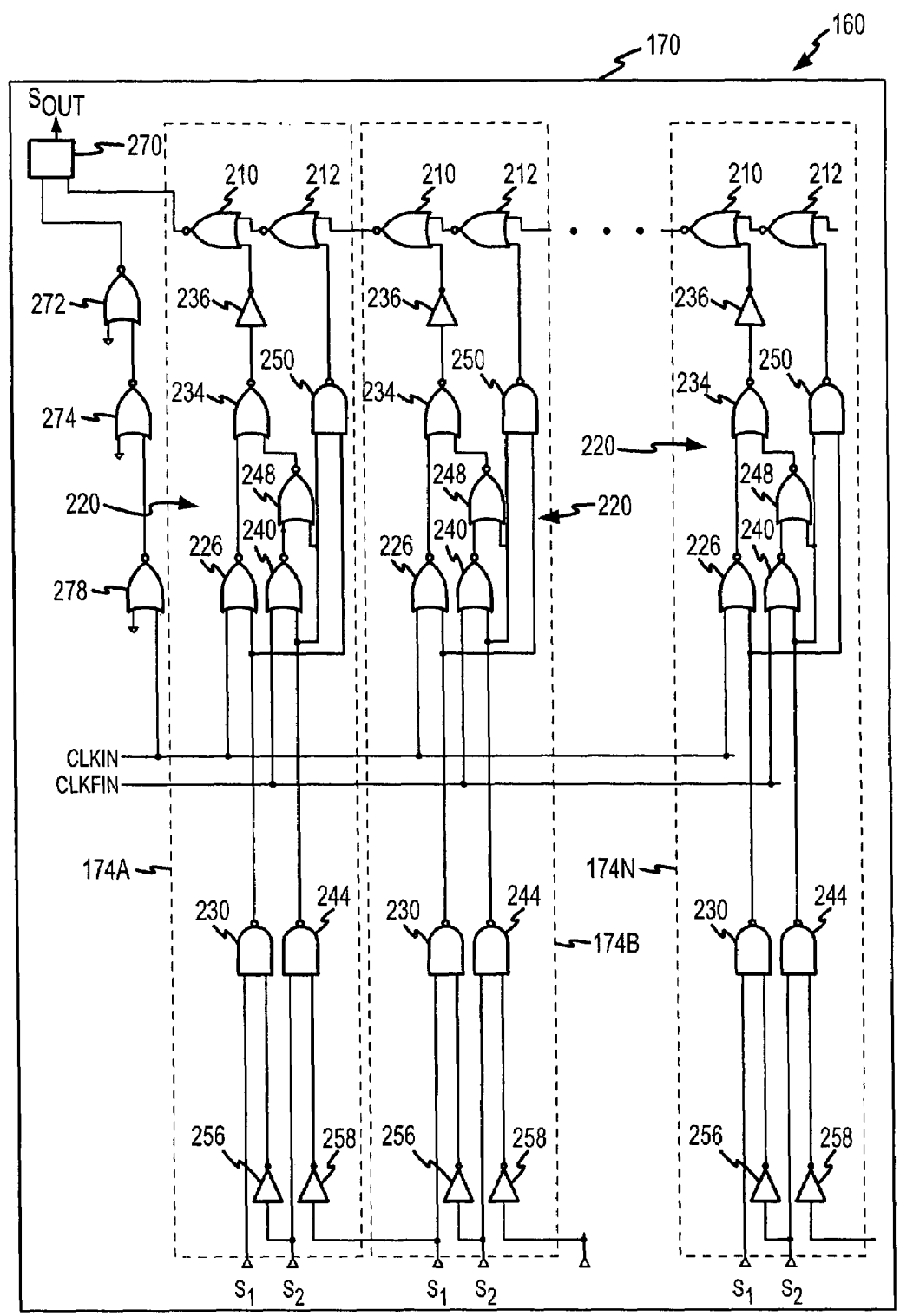
FIG. 5 is a logic diagram of one example of a signal generating delay line used in the measure control delay of FIG. 3.

A more specific example of an MCD 160 is shown in FIGS. 4 and 5. The MCD 160 includes a measuring delay line 164 shown in FIG. 4 having a plurality of serially-connected delay units 168A-N. The MCD 160 also includes a signal generating delay line 170 shown in FIG. 5 having a plurality of serially-connected delay units 174A-N. With reference, first, to FIG. 4, the first delay unit 168A in the measuring delay line 164 receives a START signal, and all of the delay units 168A-N in the measuring delay line 164 receive a STOP signal. Each of the delay units 168A-N includes a pair of serially-connected NOR gates 176, 178, each of which implement a respective delay stage. The NOR gate 176 of the first delay unit 168A receives the START signal while the NOR gates 176 of the remaining delay units 168B-N are coupled to the output of the NOR gate 178 of the preceding delay unit 168B-N. One input of the NOR gate 178 is connected to the output of the NOR gate 176, and another input of the NOR gate 178 receives the STOP signal.

The first delay unit 168A differs from the remaining delay units 168B-N by including a NOR gate 180, which is connected to the NOR gate 176 to function as a flip-flop. In response to the rising edge of the START signal, the output of the NOR gate 176 transitions low to set the flip-flop. Thereafter, the output of the NOR gate 176 remains low despite transitions in the logic level of the START signal. The flip-flop formed by the NOR gates 176, 180 is reset responsive to the rising edge of the STOP signal to cause the NOR gate 176 to output a high logic level. The NOR gate 178 then outputs a low logic level. However, the STOP signal is coupled directly to an input of the NOR gate 178 so that the output of the NOR gate 178 is able to transition low before the flip-flop has been reset.

In operation, the output of the NOR gate 176 in the first delay unit 168A transitions low and remains low one delay unit after the rising edge of the START signal, where the delay unit is equal to the switching time of the NOR gate 176. After an additional delay of one delay unit, the output of the NOR gate 178 transitions to a high logic level, assuming the switching time of the NOR gate 178 is equal to the switching time of the NOR gate 176. Similarly, in the remaining delay units 168B-N, the output of the NOR gate 176 transitions to a low logic level one delay unit after the output of the prior delay unit 168B-N transitions high, and the output of the NOR gate 178 transitions to a high logic level after an additional delay unit.

The outputs of the NOR gates 176, 178 in each of the delay units 168A-N are coupled through respective inverters 190, 192 to the data inputs of respective latches 194, 196. A clock input of each of the latches 194, 196 receives the STOP signal, and a complementary clock input of each of the latches 194, 196 receives the complement of the STOP signal. In the first delay unit 168A, the complement of the STOP signal is generated by coupling the STOP signal through an inverter 198. In the remaining delay units 168B-N, the STOP signal is coupled to the clock inputs of the latches 194, 196 through two inverters 200, 202, and the compliment of the STOP signal is generated at the output of the first inverter 200. The use of two inverters in this configuration minimizes the degree to which the large number of delay units 168A-N load circuitry (not shown) generating the STOP signal. In both the first delay unit 168A and the remaining delay units 168B-N, an $S_1$ control signal is generated at the output of the latch 194, and an $S_2$ control signal is generated at the output of an inverter 206 that is coupled to the output of the latch 196.

In operation, the compliments of the logic levels at the outputs of the NOR gates 176, 178 are stored in the latches 194, 196, respectively, responsive to the rising edge of the STOP signal. As explained above, as the rising edge of the START signal sequentially propagates through the NOR gates 176, 178, the outputs of the NOR gates 176 will transition low and the outputs of the NOR gates 178 will transition high. Therefore, the data inputs of the latches 194, 196 will also sequentially transition high and low, respectively, as the rising edge of the START signal sequentially propagates through the NOR gates 176, 178 in each of the delay units 168A-N. When the latches 194, 196 are clocked by the rising edge of the STOP signal, the $S_1$ and $S_2$ signals associated with each delay unit 168A-N through which the START signal has propagated will be high, and the $S_1$ and $S_2$ signals associated with the remaining delay units 168A-N will be low.

With reference, now, to FIG. 5, the $S_1$ and $S_2$ signals from the delay units 168A-N are used to determine the delay unit 174A-N in the signal generating delay line 170 into which the CLKIN or CLKFIN signal is injected for subsequent propagation through the remaining delay units 174A-N. Each of the delay units 174A-N includes a pair of serially-connected NOR gates 210, 212. An input of each of the NOR gates 210, 212 is coupled to a clock injection circuit 220 that receives the CLKIN and CLKFIN signals. As explained in greater detail below, the clock injection circuit 220 applies either the CLKIN signal or the CLKFIN signal to the input of the NOR gate 210. The number of delays of the CLKIN or CLKFIN signal before being applied to the NOR gate 210 is one delay greater if the START signal propagated to the NOR gate 178 rather than only to the final NOR gate 176 in the corresponding delay unit 168A-N of the measuring delay line 164.

In each of the clock injection circuits 220, the CLKIN signal is applied to a NOR gate 226 that is selectively enabled by the output of a NAND gate 230 being low. When the NOR gate 226 is enabled, the CLKIN signal is coupled through a NOR gate 234 and an inverter 236 to the input of the NOR gate 210. Similarly, the CLKFIN signal is applied to a NOR gate 240 that is selectively enabled by the output of a NAND gate 244 being low. When the NOR gate 240 is enabled, the CLKIN signal is coupled to the input of the NOR gate 210 through the NOR gate 240, a NOR gate 248, the NOR gate 234 and an inverter 236. Therefore, when the NOR gate 240 is enabled, the CLKFIN signal is coupled through an additional NOR gate 248 to provide an additional delay unit. Using the CLKFIN signal rather than the CLKIN signal compensates for the additional inversion provided by the NOR gate 248 so that the NOR gate 210 transitions in the same manner regardless of whether the CLKIN or the CLKFIN signal is applied to the NOR gate 210.

Each of the clock injection circuits 220 also includes a NAND gate 250 having a pair of inputs that are coupled to the outputs of the NAND gates 230, 244. The NAND gate 250 is used to disable the NOR gate 212 when the output of either of the NAND gates 230, 244 is low. As explained above, the output of one of the NAND gates 230, 244 will be low when either the CLKIN or the CLKFIN signal is coupled to the input of the NOR gate 210. In such case, the NOR gate 212 is disabled to prevent the CLKIN and CLKFIN signals from being applied to the NOR gate 210 from the upstream delay unit 168A-N

The NAND gate 230 has a first input that receives the $S_1$ signal from the corresponding delay unit 168A-N of the measuring delay line 164. The other input of the NAND gate 254 receives the complement of the $S_2$ signal from the same delay unit 168A-N through an inverter 256. The NAND gate 230 outputs a low to enable the CLKIN signal to be coupled through the NOR gate 226 whenever the $S_1$ signal is high and the $S_2$ signal is low. As explained above, the $S_1$ and $S_2$ signals have this pattern when the STOP signal has propagated through only the first NOR gate 176 but not the NOR gate 178 in the corresponding delay unit 168A-N of the measuring delay line 164.

The NAND gate 244 has a first input that receives the $S_2$ signal and a second input that receives through an inverter 258 the complement of the $S_1$ signal from the downstream delay unit 168A-N. The NAND gate 258 outputs a low to enable the CLKFIN signal to be coupled through the NOR gate 240 whenever the $S_2$ signal is high and the $S_1$ signal from the adjacent delay unit 168A-N is low. As explained above, the $S_1$ and $S_2$ signals have this pattern when the STOP signal has propagated through both of the NOR gates 176, 178 in the corresponding delay unit 168A-N of the measuring delay line 164 but not through the NOR gate 176 in the adjacent downstream delay unit 168A-N. Thus, if the START signal has propagated through one additional NOR gate, i.e., the NOR gate 178, in the delay unit 168A-N of the measuring delay line 164, the CLKFIN signal is coupled through one additional NOR gate, i.e., NOR gate 248, in the corresponding delay unit 174A-N of the signal generating delay line 170. The CLKIN or CLKFIN signal is then sequentially coupled through each of the NOR gates 210, 212 until it is output from the NOR gate 210 in the final delay unit 174A.

The output of the NOR gate 210 in the delay unit 174A is applied to one input of a multiplexer 270. A second input of the multiplexer 270 is coupled to receive the CLKFIN signal through three NOR gates 272, 274, 278, which function as inverters. The signal applied to the input of the multiplexer 270 is therefore in phase with the CLKIN signal. The multiplexer 270 is controlled by a Bypass Select signal, which is generated by decoding the $S_1$ and $S_2$ signals from all of the delay units 168A-N in the measuring delay line 164A-N. The $S_1$ and $S_2$ signals are all low when the START and STOP signals are received at essentially the same time. In such case, the START signal does not propagate through the measuring delay line 164. When the $S_1$ and $S_2$ signals are all low, the Bypass Select signal causes the multiplexer 270 to couple the CLKFIN directly to an $S_{OUT}$ terminal of the multiplexer 270. Otherwise, the Bypass Select signal causes the multiplexer 270 to couple the output of the signal generating delay line 170 to an $S_{OUT}$ terminal of the multiplexer 270.

It can therefore be seen that the CLKIN or CLKFIN signal propagates through the same number of NOR gates though which the START signal propagates before the rising edge of the stop signal. Therefore, the $S_{OUT}$ signal is delayed from the rising edge of the CLKIN signal by the same number of delay units that the STOP signal was delayed from the START signal. The flip-flop formed by the NOR gates 176, 180 in the first delay unit 168A of the measuring delay line is able to maintain the output of the delay unit 168A high regardless of how many times the STOP signal transitions before the rising edge of the STOP signal. Significantly, the flip-flop does not produce any unwanted delay since the NOR gate 176 is substantially identical to the NOR gates 176 used in the remaining delay units 168B-N.

An MCD according to various examples of the invention can be used for a variety of purposes in electronic devices, such as memory devices. For example, with reference to FIG. 6, a synchronous dynamic random access memory ("SDRAM") 300 includes a command decoder 304 that controls the operation of the SDRAM 300 responsive to high-level commands received on a control bus 306 and captured in command latches 308. The commands are captured in the command latches 308 responsive to a first internal clock signal $CLK_{I1}$ generated by an MCD 310 from an external clock signal $CLK_E$. These high level commands, which are typically generated by a memory controller (not shown in FIG. 6), are a clock enable CKE*, a clock CLK, a chip select CS*, a write enable WE*, a row address strobe RAS*, a column address strobe CAS*, and a data mask DQM, in which the "*" designates the command as active low. The command decoder 304 generates a sequence of control signals responsive to the high level commands to carry out the function (e.g., a read or a write) designated by each of the high level commands. These commands, and the manner in which they accomplish their respective functions, are conventional. Therefore, in the interest of brevity, a further explanation of these commands will be omitted.

The SDRAM 300 includes an address register 312 that receives row addresses and column addresses from a memory controller (not shown in FIG. 6) through an address bus 314. The addresses coupled through the address bus 314 are captured in address latches 316 and then applied to the address register 312. The addresses are captured in the address latches 316 responsive to a second internal clock signal $CLK_{I2}$ that is generated by an MCD 318 from the external clock signal $CLK_E$. A row address is generally first received by the address register 312 and applied to a row address multiplexer 319. The row address multiplexer 319 couples the row address to a number of components associated with either of two memory banks 320, 322 depending upon the state of a bank address bit forming part of the row address. Associated with each of the memory banks 320, 322 is a respective row address latch 326, which stores the row address, and a row decoder 328, which decodes the row address and applies corresponding signals to one of the arrays 320 or 322. The row address multiplexer 319 also couples row addresses to the row address latches 326 for the purpose of refreshing the memory cells in the arrays 320, 322. The row addresses are generated for refresh purposes by a refresh counter 330, which is controlled by a refresh controller 332. The refresh controller 332 is, in turn, controlled by the command decoder 304.

After the row address has been applied to the address register 312 and stored in one of the row address latches 326, a column address is applied to the address register 312. The address register 312 couples the column address to a column address latch 340. Depending on the operating mode of the SDRAM 300, the column address is either coupled through a burst counter 342 to a column address buffer 344, or to the burst counter 342, which applies a sequence of column addresses to the column address buffer 344 starting at the column address output by the address register 312. In either case, the column address buffer 344 applies a column address to a column decoder 348.

Data to be read from one of the arrays 320, 322 are applied to column circuitry 354, 355 for one of the arrays 320, 322, respectively. The data are then coupled through a data output register 356 to read data latches 357. The read data latches 357 apply the read data to the data bus 358 responsive to an internal read data strobe signal $RDS_I$ generated by an MCD 360 responsive to the external clock signal $CLK_E$.

Data to be written to one of the arrays 320, 322 are coupled through the data bus 358 and applied to write data latches 362. The write data latches 362 apply the write data to a data input register 364 responsive to an internal write data strobe signal $WDS_I$ generated by an MCD 368 responsive to an external write data strobe signal $WDS_E$. The data input register 364 applies the write data to the column circuitry 354, 355 where they are transferred to one of the arrays 320, 322, respectively. A mask register 370 responds to a data mask DQM signal to selectively alter the flow of data into and out of the column circuitry 354, 355, such as by selectively masking data to be read from the arrays 320, 322.

The MCDs 310 318, 360, 368 used in the SDRAM 300 may be MCDs according to any example of the MCDs described herein, or they may be MCD's according to some other example of the invention. Also, it is not necessary to use an MCD to capture commands, addresses and data. Instead, an MCD may be used to capture one or more of commands, addresses and data. Further, an MCD may be used in the SDRAM 300 or in some other device for purposes other than as described herein.

Figure 6:
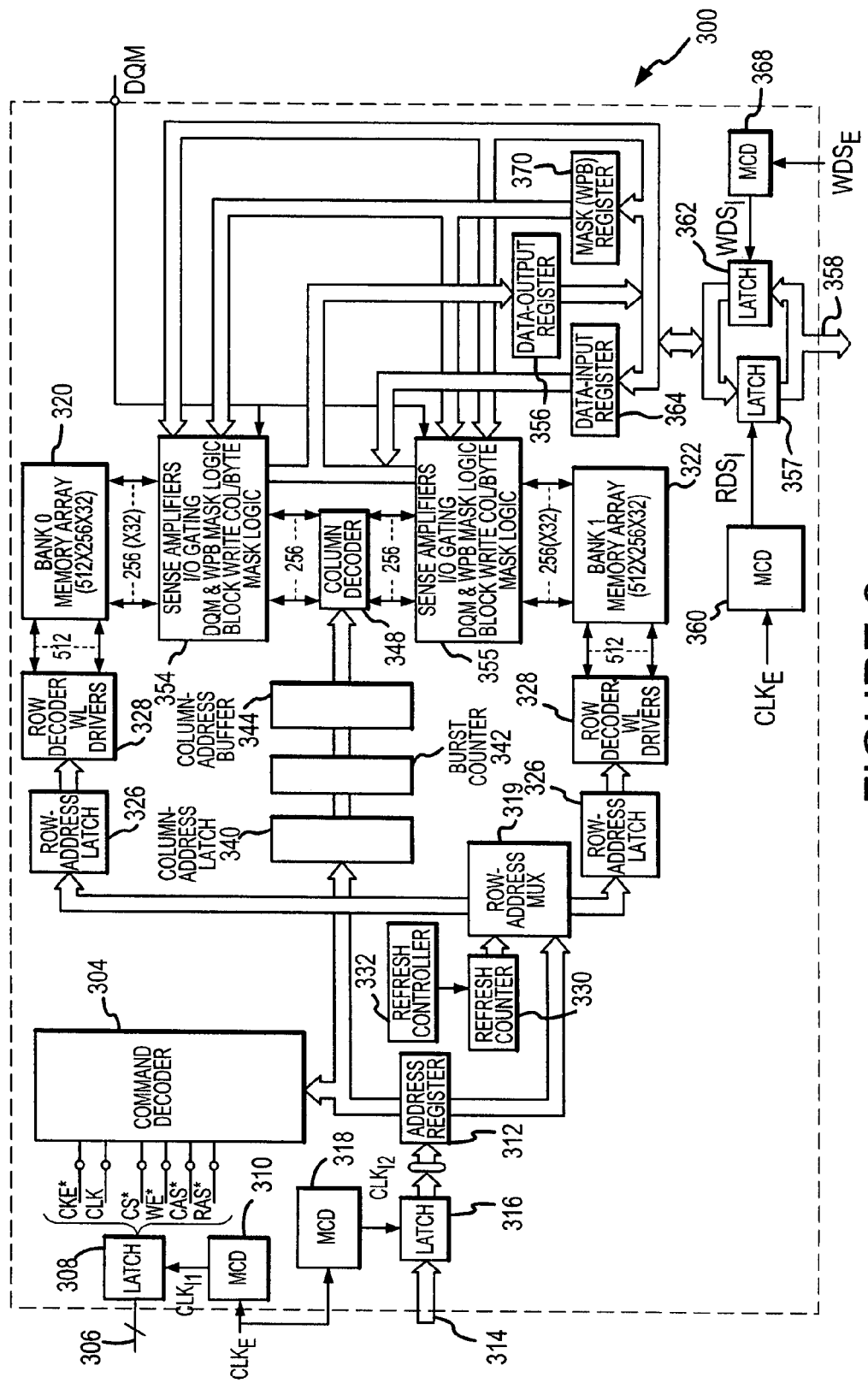
FIG. 6 is a block diagram of a memory device using signals generated by a measure control delay according to one example of the invention.
Figure 7:
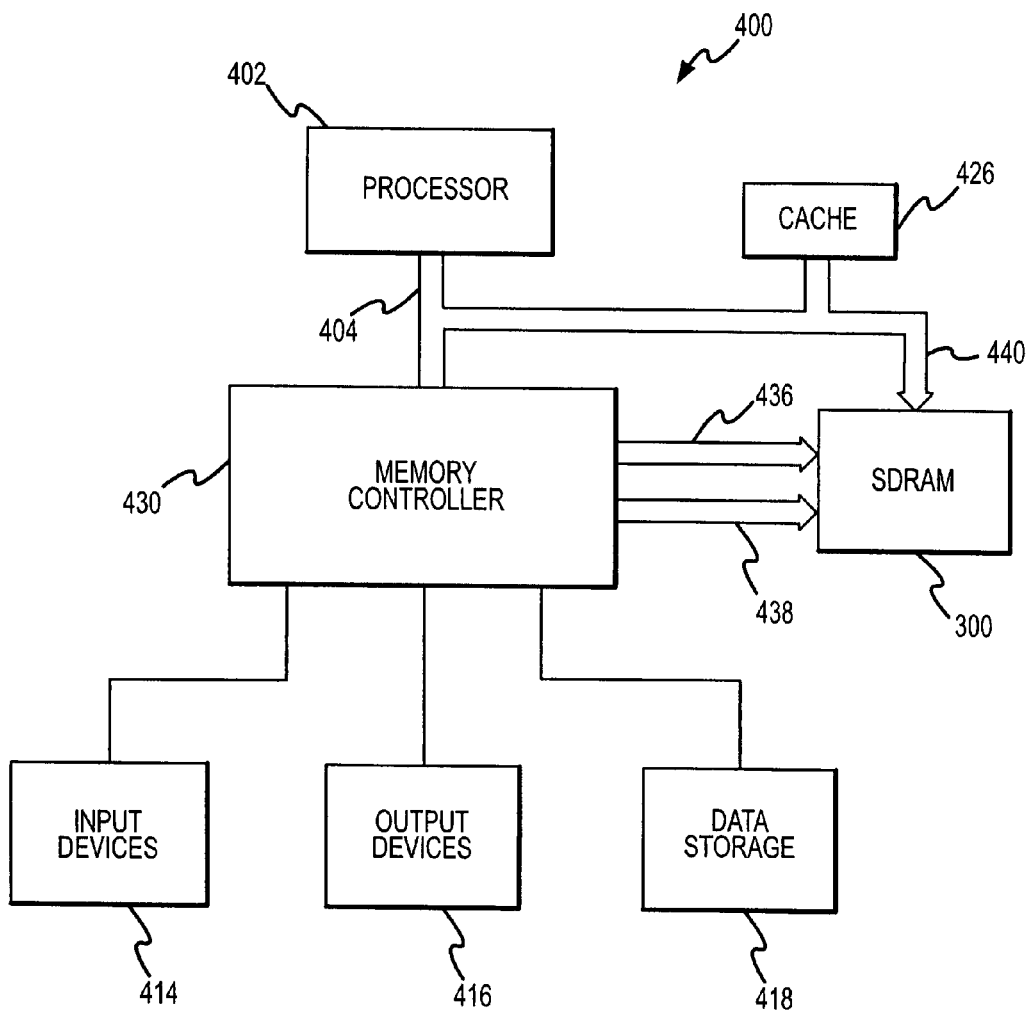
FIG. 7 is a block diagram of a processor-based system using the memory device of FIG. 6.

The SDRAM 300 shown in FIG. 6 can be used in various electronic systems. For example, it may be used in a computer system, such as a computer system 400 shown in FIG. 7. The computer system 400 includes a processor 402 for performing various computing functions, such as executing specific software to perform specific calculations or tasks. The processor 402 includes a processor bus 404 that normally includes an address bus, a control bus, and a data bus. In addition, the computer system 400 includes one or more input devices 414, such as a keyboard or a mouse, coupled to the processor 402 to allow an operator to interface with the computer system 400. Typically, the computer system 400 also includes one or more output devices 416 coupled to the processor 402, such output devices typically being a printer or a video terminal. One or more data storage devices 418 are also typically coupled to the processor 402 to allow the processor 402 to store data in or retrieve data from internal or external storage media (not shown). Examples of typical storage devices 418 include hard and floppy disks, tape cassettes, and compact disk read-only memories (CD-ROMs). The processor 402 is also typically coupled to cache memory 426, which is usually static random access memory ("SRAM"), and to the SDRAM 300 through a memory controller 430. The memory controller 330 normally includes a control bus 436 and an address bus 438 that are coupled to the SDRAM 300. A data bus 440 is coupled from the SDRAM 300 to the processor bus 404 either directly (as shown), through the memory controller 430, or by some other means.

Although the present invention has been described with reference to the disclosed embodiments, persons skilled in the art will recognize that changes may be made in form and detail without departing from the spirit and scope of the invention. Such modifications are well within the skill of those ordinarily skilled in the art. Accordingly, the invention is not limited except as by the appended claims.

I claim:

1. A measure controlled delay circuit, comprising:
a measuring delay line circuit having a plurality of delay units connected in series and adapted to receive a first input signal, the measuring delay line circuit operable to hold a first logic state in each delay unit as the first input signal is propagated consecutively through the delay units, the measuring delay line circuit further adapted to receive a second input signal, each of the delay units being operable responsive to receiving the second input signal to assert the first logic state if the first input signal has propagated through and assert a second logic state if the first input signal has not propagated through the respective delay unit; and
a signal generating delay line circuit having a plurality of delay units connected in series and adapted to receive at least a third input signal, each of the delay units of the signal generating delay line circuit adapted to receive the logic state of a corresponding delay unit of the measuring delay line circuit, the signal generating delay line circuit operable to generate an output signal by propagating at least the third input signal through a substantially equal number of delay units in the signal generating delay line circuit as the number of delay units through which the first input signal propagated through in the measuring delay line circuit.

2. The measure controlled delay circuit of claim 1 further comprising a first delay unit of the plurality of delay units comprising:
a first logic gate adapted to receive and delay the first input signal as the first input signal propagates through; and
at least a second logic gate coupled to the first logic gate, and operable to hold the logic level at the output of the first logic gate constant.

3. The measure controlled delay circuit of claim 2 wherein the first logic gate and the at least second logic gate form a flip-flop to hold the logic level at the output of the first logic gate.

4. The measure controlled delay circuit of claim 3 wherein the output of the flip-flop is coupled to a third logic gate operable to invert the logic level held by the flip-flop to generate the first logic state applied to a first logic gate of the adjacent delay unit.

5. The measure controlled delay circuit of claim 1 further comprising a first delay unit of the plurality of delay units operable to hold and maintain the first logic state responsive to receiving the first input signal, and wherein each of the delay units maintains the first logic state of the first delay unit as the first input signal propagates through the respective delay unit.

6. The measure controlled delay circuit of claim 5 wherein the first input signal comprises a start signal to which a delay is applied as the start signal propagates through each of the delay units, and wherein the second input signal comprises a stop signal that terminates the propagation of the start signal responsive to the stop signal.

7. The measure controlled delay circuit of claim 6 wherein each delay unit of the measuring delay line circuit comprises:
a first logic gate through which the first input signal propagates through to delay the first input signal, the first logic gate having an output;
at least a second logic gate coupled to the output of the first logic gate through which the first input signal propagates through to further delay the first input signal, the at least second logic gate having an output adapted to provide the delayed first input signal to propagate through a first logic gate of the adjacent delay unit;
a first latch having a data input coupled to an output of the first logic gate, a clock input coupled to receive the second input signal, and an output coupled to a first control output of the respective delay unit; and
a second latch having a data input coupled to an output of the second logic gate, a clock input coupled to receive the second input signal, and an output coupled to a second control output of the respective delay unit.

8. The measure controlled delay circuit of claim 7 wherein each of the delay units generates a first control signal at the first control output responsive to the output of the first logic gate and a second control signal at the second control output responsive to the output of the at least second logic gate, each of the first and second control signals being indicative of the first logic state if the first input signal has propagated through and the second logic state if the first input signal has not propagated through the respective delay unit.

9. The measure controlled delay circuit of claim 8 wherein each delay unit of the signal generating delay line circuit comprises:
at least a third logic gate having first and second inputs and an output, the output of the third logic gate being coupled to an output of the respective delay unit;
a fourth logic gate having first and second inputs and an output, the output of the fourth logic gate being coupled to the first input of the third logic gate, the first input of the fourth logic gate being coupled to an input of the respective delay unit;
a fifth logic gate having a first input coupled to receive the at least third input signal, a second input coupled to receive the first control signal from a corresponding one of the delay units of the measuring delay line, and an output coupled to the second input of the third logic gate so that, when the fifth logic gate is enabled by the first control signal, the at least third input signal is coupled to the second input of the third logic gate through the fifth logic gate;
a sixth logic gate having a first input and an output coupled to the second input of the third logic gate; and
a seventh logic gate having a first input coupled to receive the at least third input signal, a second input coupled to receive the second control signal from a corresponding one of the delay units of the measuring delay line, and an output coupled to the first input of the sixth logic gate so that, when the seventh logic gate is enabled by the second control signal, the at least third input signal is coupled to the second input of the third logic gate through both the sixth logic gate and the seventh logic gate.

10. The measure controlled delay circuit of claim 9 wherein the at least third control signal is a clock signal.

11. A memory device, comprising:
at least one memory bus operable to receive command signals, address signals and data signals;
a row decoder coupled to the memory bus, the row decoder operable to receive and decode row address signals;
a column decoder coupled to the memory bus, the column decoder operable to receive and decode column address signals;
an array of memory cells operable to store data written to the array at a location determined by the decoded row and column address signals; and
a signal generator circuit operable to generate an output signal synchronized to an external clock signal for capturing at least one of the command signals, address signals and data signals, the signal generator circuit comprising:
a measuring delay line having a plurality of delay units coupled in series with each other from an initial delay unit coupled to receive a first input signal, the measuring delay line operable to propagate the first input signal through the delay units from the initial delay unit toward the final delay unit, and further operable to select a logic level at the initial delay unit and maintain the selected logic level as the first input signal is propagated through the delay units, each of the delay units in the measuring delay line configured to generate a control output that changes state when the first input signal has propagated through the respective delay unit; and
a signal generating delay line receiving a clock signal and having a plurality of delay units coupled in series with each other from an initial delay unit to a final delay unit from which the output signal is generated, the delay units of the signal generating delay line having control inputs to receiving corresponding control outputs from the delay units of the measuring delay line, the signal generating delay line operable to generate the output signal by propagating the clock signal through the delay units of the signal generating delay line being controlled by the states of the control output received from the delay units of the measure delay line.

12. The memory device of claim 11 wherein the measuring delay line receives a second input signal, wherein the first input signal comprises a start signal to which a delay is applied as the start signal propagates through each of the delay units, and the second input signal comprises a stop signal that terminates the propagation of the start signal responsive to the stop signal.

13. The memory device of claim 12 wherein the initial delay unit comprises:
a first logic gate having a first input, a second input and an output, the first logic gate adapted to delay the first input signal received at the first input as the first input signal propagates through, the first logic gate operable to change logic states responsive to the first input signal; and
at least a second logic gate coupled to the second input of the first logic gate, and operable to hold the logic level at the output of the first logic gate constant.

14. The memory device of claim 13 wherein each of the delay units coupled in series with the initial delay unit of the measuring delay line circuit comprises:
a third logic gate adapted to receive and delay the first input signal as the first input signal propagates through, the third logic gate operable to change logic states responsive to the first input signal propagating through;
at least a fourth logic gate having a first input coupled to an output of the third logic gate by which the first input signal propagates through to further delay the first input signal, the at least fourth logic gate having a second output coupled to receive the second input signal, the at least fourth logic gate operable to change states when the first input signal has propagated through;
a first latch having a data input coupled to an output of the at least fourth logic gate, a clock input coupled to receive the second input signal, and an output coupled to a first control output of the respective delay unit to output a first control signal responsive to the second input signal; and
a second latch having a data input coupled to an output of the at least fourth logic gate, a clock input coupled to receive the second input signal, and an output coupled to a second control output of the respective delay unit to output a second control signal responsive to the second input signal.

15. The memory device of claim 14 wherein each delay unit of the signal generating delay line circuit comprises:
at least a fifth logic gate having first and second inputs and an output, the output of the fifth logic gate being coupled to an output of the respective delay unit;
a sixth logic gate having first and second inputs and an output, the output of the sixth logic gate being coupled to the first input of the fifth logic gate, the first input of the sixth logic gate being coupled to an input of the respective delay unit;
a seventh logic gate having a first input coupled to receive the clock signal, a second input coupled to receive the first control signal from a corresponding one of the delay units of the measuring delay line, and an output coupled to the second input of the fifth logic gate so that, when the seventh logic gate is enabled by the first control signal, the clock signal is coupled to the second input of the fifth logic gate through the seventh logic gate;
an eighth logic gate having a first input and an output coupled to the second input of the fifth logic gate; and
a ninth logic gate having a first input coupled to receive the clock signal, a second input coupled to receive the second control signal from a corresponding one of the delay units of the measuring delay line, and an output coupled to the first input of the eighth logic gate so that, when the ninth logic gate is enabled by the second control signal, the clock signal is coupled to the second input of the fifth logic gate through both the eighth logic gate and the ninth logic gate.

16. An integrated circuit, comprising:
a functional circuit receiving a first input signal and generating an output signal, the functional circuit receiving a clock signal for performing an operation on the first input signal to generate the output signal; and
a signal generator circuit coupled to the functional circuit for generating the clock signal, the signal generator circuit comprising:
a measuring delay line having a plurality of delay units coupled in series with each other from an initial delay unit coupled to receive a second input signal to a final delay unit, the measuring delay line operable to propagate the second input signal through the delay units from the initial delay unit toward the final delay unit, and further operable to select a logic level at the initial delay unit and maintain the selected logic level as the second input signal is propagated through the delay units, each of the delay units having a control output that changes state when the second input signal has propagated through the respective delay unit; and
a signal generating delay line receiving a third input signal and having a plurality of delay units coupled in series with each other from an initial delay unit to a final delay unit from which the clock signal is generated, the delay units of the signal generating delay line having control inputs to receiving corresponding control outputs from the delay units of the measuring delay line, the signal generating delay line operable to generate the clock signal by propagating the third input signal through the delay units of the signal generating delay line being controlled by the states of the control output received from the delay units of the measure delay line.

17. The integrated circuit of claim 16 wherein the initial delay unit comprises:
   a first logic gate having a first input, a second input and an output, the first logic gate adapted to delay the second input signal received at the first input as the second input signal propagates through, the first logic gate operable to change logic states at the output responsive to the second input signal; and
   at least a second logic gate coupled to the second input of the first logic gate, and operable to hold the logic level at the output of the first logic gate constant.

18. The integrated circuit of claim 17 wherein the second input signal comprises a start signal to which the delays are applied as the start signal propagates through each of the delay units, and wherein the measuring delay line receives a stop signal that terminates the propagation of the start signal, wherein the control output does not change states if the start signal has not propagated through the respective delay unit.

19. The integrated circuit of claim 18 wherein each of the delay units coupled in series with the initial delay unit of the measuring delay line circuit comprises:
   a third logic gate having an input and an output, the third logic gate adapted to receive and delay the second input signal as the second input signal propagates through;
   at least a fourth logic gate having an output and an input coupled to the output of the third logic gate by which the second input signal propagates through to further delay the second input signal;
   a first latch having a data input coupled to the output of the at least fourth logic gate, a clock input coupled to receive the stop signal, and an output coupled to a first control output of the respective delay unit to output a first control signal responsive to receiving the stop signal; and
   a second latch having a data input coupled to the output of the at least fourth logic gate, a clock input coupled to receive the stop signal, and an output coupled to a second control output of the respective delay unit to output a second control signal responsive to receiving the stop signal.

20. The integrated circuit of claim 18 wherein each delay unit of the signal generating delay line circuit comprises:
   at least a fifth logic gate having first and second inputs and an output, the output of the fifth logic gate being coupled to an output of the respective delay unit;
   a sixth logic gate having first and second inputs and an output, the output of the sixth logic gate being coupled to the first input of the fifth logic gate, the first input of the sixth logic gate being coupled to an input of the respective delay unit;
   a seventh logic gate having a first input coupled to receive the third input signal, a second input coupled to receive the first control signal from a corresponding one of the delay units of the measuring delay line, and an output coupled to the second input of the fifth logic gate so that, when the seventh logic gate is enabled by the first control signal, the third input signal is coupled to the second input of the fifth logic gate through the seventh logic gate;
   an eighth logic gate having a first input and an output coupled to the second input of the fifth logic gate; and
   a ninth logic gate having a first input coupled to receive the third input signal, a second input coupled to receive the second control signal from a corresponding one of the delay units of the measuring delay line, and an output coupled to the first input of the eighth logic gate so that, when the ninth logic gate is enabled by the second control signal, the third input signal is coupled to the second input of the fifth logic gate through both the eighth logic gate and the ninth logic gate.

21. A method of operating a signal generator circuit to generate an output signal synchronized to an external clock signal, the method comprising:
   receiving a start signal and storing a logic state responsive to receiving the start signal;
   incrementally applying a plurality of delays to the start signal while maintaining the logic level of the stored logic state constant as each delay is being incrementally applied to the start signal;
   receiving a stop signal and terminating the act of incrementally applying the delays on the start signal;
   asserting a change of state in a control output signal generated for each incremental delay applied to the start signal; and
   generating an output signal by incrementally applying a delay to a received clock signal, each incrementally applied delay to the clock signal corresponding to each change of state that occurred in the control output signals generated responsive to incremental delays applied to the start signal.

22. The method of claim 21 wherein storing the logic state responsive to receiving the start signal comprises maintaining the logic state constant independent of the logic level of the start signal transitioning as the start signal is incrementally delayed.

23. The method of claim 21 wherein generating the output signal comprises applying a number of delays to the received clock signal that is substantially equal to the number of delays applied to the start signal.

24. A method of operating a measuring delay line, the method comprising:
   receiving a first input signal and holding a first logic state in a first delay stage responsive to the first input signal;
   delaying the first input signal;
   propagating the delayed first input signal to a second delay stage while maintaining the first logic state constant;
   propagating the delayed first input signal to subsequent delay stages to apply subsequent delays on the first input signal, each preceding delay stage providing the delayed first input signal to the next delay stage while maintaining the first logic state in the respective delay stage; and
   generating a logic control signal at each delay stage and changing the logic level of the logic control signal when the first input signal has propagated through the respective delay stage.

25. The method of claim 24 further comprising:
   terminating the propagation of the delayed first input signal responsive to receiving a second input signal; and
   generating a second logic control signal at each delay stage indicative of a logic state that maintains an initial state if the first input signal did not propagate through the respective delay stage.

26. The method of claim 25 wherein terminating the propagation of the delayed first input signal responsive to receiving the second input signal comprises resetting each of the delay stages responsive to receiving the second input signal.

* * * * *